United States Patent
Yamaguchi et al.

(10) Patent No.: US 7,345,339 B2
(45) Date of Patent: Mar. 18, 2008

(54) VERTICAL CHANNEL FET WITH SUPER JUNCTION CONSTRUCTION

(75) Inventors: Hitoshi Yamaguchi, Nisshin (JP); Mikimasa Suzuki, Toyohashi (JP); Yoshiyuki Hattori, Aichi-gun (JP)

(73) Assignee: DENSO CORPORATION, Kariya (JP)

( * ) Notice: Subject to any disclaimer, the term of this patent is extended or adjusted under 35 U.S.C. 154(b) by 45 days.

(21) Appl. No.: 10/872,789

(22) Filed: Jun. 22, 2004

(65) Prior Publication Data

US 2005/0006717 A1    Jan. 13, 2005

(30) Foreign Application Priority Data

Jun. 24, 2003    (JP)    .............................. 2003-179635

(51) Int. Cl.
*H01L 29/76*    (2006.01)
(52) U.S. Cl. ...................... 257/332; 257/331; 257/508; 257/E29.067; 257/E29.26
(58) Field of Classification Search ................ 257/270, 257/508, 328–332, 725, 728, E21.419, E29.067, 257/E29.26
See application file for complete search history.

(56) References Cited

U.S. PATENT DOCUMENTS

| | | | |
|---|---|---|---|
| 5,674,766 A | 10/1997 | Darwish et al. | ............... 437/40 |
| 6,040,600 A | 3/2000 | Uenishi et al. | ............. 257/330 |
| 6,049,108 A * | 4/2000 | Williams et al. | ............ 257/341 |
| 6,294,818 B1 | 9/2001 | Fujihira | ...................... 257/409 |
| 6,551,909 B1 | 4/2003 | Fujihira | ...................... 438/510 |
| 6,828,195 B2 * | 12/2004 | Mo et al. | ..................... 438/270 |
| 6,900,109 B2 * | 5/2005 | Onishi et al. | ............... 438/419 |
| 2003/0001203 A1 | 1/2003 | Ono et al. | ................... 257/330 |

FOREIGN PATENT DOCUMENTS

| | | |
|---|---|---|
| JP | A-2000-260984 | 9/2000 |
| JP | A-2001-127289 | 5/2001 |
| JP | A-2002-203963 | 7/2002 |

OTHER PUBLICATIONS

First Office Action issued from the U.S. Patent Office on Jul. 5, 2007 for the related divisional U.S. Appl. No. 11/356,984 (a copy enclosed).

* cited by examiner

*Primary Examiner*—Howard Weiss
*Assistant Examiner*—John C Ingham
(74) *Attorney, Agent, or Firm*—Posz Law Group, PLC

(57) ABSTRACT

A semiconductor device includes a body region, a drift region having a first part and a second part, and a trench gate electrode. The body region is disposed on the drift region. The first and second parts extend in an extending direction so that the second part is adjacent to the first part. The trench gate electrode penetrates the body region and reaches the drift region so that the trench gate electrode faces the body region and the drift region through an insulation layer. The trench gate electrode extends in a direction crossing with the extending direction of the first and second parts. The first part includes a portion near the trench gate electrode, which has an impurity concentration equal to or lower than that of the body region.

19 Claims, 13 Drawing Sheets

VERTICAL CHANNEL FET WITH SUPER JUNCTION CONSTRUCTION

CROSS REFERENCE TO RELATED APPLICATION

This application is based on Japanese Patent Application No. 2003-179635 filed on Jun. 24, 2003, the disclosure of which is incorporated herein by reference.

FIELD OF THE INVENTION

The present invention relates to a semiconductor device having a super junction construction and a method for manufacturing the same.

BACKGROUND OF THE INVENTION

A vertical type MOSFET (i.e., metal-oxide semiconductor field effect transistor) having a trench gate electrode has low on-state resistance and high withstand voltage. Therefore, the vertical type MOSFET is suitably used for a switching device in power electronic equipment. When the on-state resistance and the withstand voltage are improved much more, a relationship between the on-state resistance and the withstand voltage shows a trade-off relationship. Specifically, when the on-state resistance is reduced, the withstand voltage decreases. When the withstand voltage is increased, the on-state resistance increases.

In view of the above trade-off relationship, a vertical type MOSFET having a trench gate electrode with a super junction construction is disclosed in Japanese Patent Application Publications No. H09-266311 (i.e., U.S. Pat. No. 6,294,818) and No. 2000-260984.

As shown in FIG. 1, a semiconductor device 1 disclosed in Japanese Patent Application Publication No. H09-266311 has a MOSFET with a drift region 23 having a super junction construction. The device 1 includes a source region 32, a body region 30, the drift region 23, a drain region 22, and a trench gate electrode 36. The source region 32 has N type conductivity, and connects to a source power supply S. The body region 30 has P type conductivity, and separates between the source region 32 and the drift region 23. The drift region 23 includes a P type column 24 and an N type column 26. The P type column 24 extends between a body region 30 and a drain region 22. The N type column 26 adjacent to the P type column 24 extends between the body region 30 and the drain region 22. The P type column 24 and the N type column 26 are combined so that they provide an alternation of strata, (i.e., an alternate layer). The alternate layer is repeated alternately so that the drift region 23 is formed. The drain region 22 has the N type conductivity, and the drain region 22 is connected to a drain power supply D through the drain electrode 20. A trench gate electrode 36 penetrates the body region 30, and reaches the drift region 23. The body region 30 separates between the source region 32 and the drift region 23. The trench gate electrode 36 extends in a repeat direction, in which the alternate layer of the P type column 24 and the N type column 26 is repeated alternately. The trench gate electrode 36 faces a semiconductor region composed of the source region 32, the body region 30, and the drift region 23 through an insulation layer 34. The trench gate electrode 36 is connected to a gate power supply G.

When the trench gate electrode 36 of the semiconductor device 1 is applied with positive voltage, an inversion layer is formed in the body region 30 having the P type conductivity, which faces a side of the trench gate electrode 36. The inversion layer of the body region 30 becomes a channel. Therefore, electrons supplied to the source region 32 from the source power supply S pass through the channel of the body region 30 and the N type column 26, and then, flows toward the N type drain region 22.

When the trench gate electrode 36 is grounded, no inversion layer is formed in the P type body region 30 facing the side of the trench gate electrode 36. Therefore, the semiconductor device 1 becomes off state. When the source voltage and the gate voltage are set to be zero Volts, and an inversion bias voltage is applied to the semiconductor device 1, a depletion layer extends in the P type column 24 and the N type column 26 from a P-N junction surface between the P type column 24 and the N type column 26. Here, the drain voltage is set to be a positive voltage. At this time, each impurity concentration of the P type column 24 and the N type column 26 and a column width (i.e., a pitch in the repeat direction) of them are disposed in an appropriate range, the depletion layer expands uniformly in the whole area of the P type column 24 and the N type column 26, so that the whole area of them is completely depleted substantially. Thus, the off state withstand voltage becomes high.

The on state resistance of the semiconductor device 1 is the sum of a channel resistance, a drift resistance and a resistance of the N type drain region 22. The channel resistance is a resistance of the channel formed around the trench gate electrode 36. Specifically, the channel resistance is the resistance of the channel of the body region 30. The drift resistance is a resistance of the N type column 26. In the vertical type MOSFET shown in FIG. 1, the drift resistance constitutes a large percentage of the on state resistance of the semiconductor device 1. Therefore, it is effective to reduce the drift resistance for reducing the on state resistance of the semiconductor device 1. Specifically, the on state resistance of the N type column 26 can be reduced by increasing the impurity concentration of the N type column 26.

When the impurity concentration of the N type column 26 is increased, the impurity concentration of the P type column 24 is required to be increased. This is because the depletion layer expanding in the P type column 24 and the N type column 26 from the P-N junction surface may become imbalanced if the impurity concentration of the P type column 24 is not increased. Therefore, to deplete the drift region 23 completely, the column width of the N type column 26 is required to be smaller than that of the P type column 24. Each column width is defined by a pitch in the repeat direction. However, if the column width of the N type column 26 becomes small, a cross sectional area of the N type column 26 is reduced, so that it is difficult to reduce the resistance of the N type column 26.

Therefore, it is required that the impurity concentration of the P type column 24 is increased in accordance with increase of the impurity concentration of the N type column 26, and the column width of the P type column 24 is equalized to that of the N type column 26.

In the semiconductor device 1 shown in FIG. 1, as the drift resistance of the on state resistance becomes smaller, i.e., as the impurity concentration of the N type column 26 becomes higher, the impurity concentration of the P type column 24 becomes higher.

FIG. 2A is an enlarged perspective view showing around the trench gate electrode 36 of the semiconductor device 1 shown in FIG. 1. As described above, in a case where the impurity concentration of the P type column 24 is increased so as to reduce the drift resistance, a portion of the P type column 24 facing the trench gate electrode 36 is not reversed even when the positive voltage is applied to the trench gate electrode 36. The portion of the P type column 24 is shown as a region surrounded by a dashed line in FIG. 2A. Therefore, even when the inversion layer is formed in the body region 30 facing the trench gate electrode 36, a part of the inversion layer disposed on the upside of the P type column 24 does not flow current. FIG. 2B shows a state where the current does not flow in the part of the inversion layer. The portion of the body region 30 disposed on the P type column 24 hardly flow the current. The current only flows through the inversion layer of the body region 30, which faces the trench gate electrode 36 and is disposed on the N type column 26. Specifically, the current flows through a portion shown as a shadow area in FIG. 2B. Therefore, in the semiconductor device 1 shown in FIG. 1, the whole area of the inversion layer (i.e., the channel) of the body region 30 facing the trench gate electrode 36 does not work as a current path. Thus, the channel resistance does not become lower.

Another semiconductor device is disclosed in Japanese Patent Application Publication No. 2000-260984. In the semiconductor device, the impurity concentration of the N type column 26 is increased so that the resistance of the drift region 23 is reduced. Further, the inversion layer (i.e., the channel) formed in the body region 30 is effectively used for reducing the channel resistance. The semiconductor device includes an N type channel region disposed between the drift region 23 and the body region 30 in the super junction construction.

The N type channel region provides the current path between the inversion region disposed on the P type column 24 and the N type column 26 through the N type channel region. In this case, the inversion layer of the body region 30 facing the trench gate electrode 36, specifically, the inversion layer disposed on the P type column 24 can flow the current. Here, the inversion layer disposed on the P type column 24 in the semiconductor device 1 shown in FIG. 1 does not flow the current. Therefore, the channel resistance is decreased.

In the semiconductor device, the impurity concentration of the N type column 26 is increased so that the drift resistance is reduced. Further, the N type channel region provides to reduce the channel resistance. However, the semiconductor device necessitates the N type channel region. Further, a method for manufacturing the semiconductor device necessitates an additional process for forming the N type channel region.

Furthermore, the N type channel region causes a floating of electric potential in the P type column 24. When the potential of the P type column 24 is unstable, the P-N junction surface between the P type column 24 and the N type column 26 is not applied with sufficient voltage, so that the P type and N type columns 24, 26 may not be depleted. Thus, the withstand voltage is unstable.

SUMMARY OF THE INVENTION

In view of the above-described problem, it is an object of the present invention to provide a semiconductor device having low on state resistance without increasing an additional process for forming an additional part.

A semiconductor device includes: a body region having a first conductive type; a drift region including a first part and a second part; and a trench gate electrode. The body region is disposed on the drift region. The first part of the drift region has the first conductive type, and extends in an extending direction. The second part of the drift region has the second conductive type, is disposed adjacent to the first part of the drift region, and extends in the extending direction. The trench gate electrode penetrates the body region and reaches the drift region so that the trench gate electrode faces the body region and the drift region through an insulation layer. The trench gate electrode extends in a direction crossing with the extending direction of the first and second parts. The first part of the drift region includes a portion near the trench gate electrode. The portion of the first part has an impurity concentration, which is equal to or lower than that of the body region.

In the above semiconductor device, the impurity concentration of the portion of the first part is lower than that of the body region, so that the on state resistance is reduced. This is because the channel resistance in the device is much reduced so that the total on state resistance is decreased. Thus, the channel resistance is reduced without increasing an additional part such as the N type channel region. Therefore, the manufacturing cost of the semiconductor device becomes lower. Further, since the device does not have the N type channel region, the potential of the first part is prevented from floating so that the potential of the first part is stable. Thus, the withstand voltage is also stable.

Preferably, the first part of the drift region except for the portion near the trench gate electrode has another impurity concentration, which is equal to or higher than that of the body region.

Preferably, the portion of the first part is the whole first part so that the impurity concentration of the whole first part is equal to or lower than that of the body region.

Preferably, the device further includes a plurality of trench gate electrodes aligned in parallel together. The trench gate electrodes are disposed separately so that the body region is sandwiched between two trench gate electrodes.

Further, a method for manufacturing a semiconductor device includes the steps of: forming a plurality of second parts having a second conductive type, wherein each second part is disposed separately; forming a plurality of first parts having a first conductive type, wherein each first part is disposed between two second parts so that a drift region including the first and second parts aligned alternately in a repeat direction is provided; forming a body region having the first conductive type on the drift region; forming a trench, which penetrates the body region and reaches the drift region, wherein the trench extends in parallel to the repeat direction; forming an insulation film on an inner wall of the trench; and embedding a gate electrode in the trench through the insulation film.

The above method provides a semiconductor device having a small on state resistance. Further, the manufacturing cost of the semiconductor device becomes lower. Further, since the device does not have the N type channel region, the potential of the first part is prevented from floating so that the potential of the first part is stable. Thus, the withstand voltage is also stable.

Preferably, the method further includes the step of reducing an impurity concentration of a portion of the first part of the drift region so that the impurity concentration of the portion is equal to or lower than that of the body region. The portion of the first part is disposed near the trench gate electrode.

Preferably, the step of forming the first parts is performed by an epitaxial growth method. The step of forming the body region is performed by the epitaxial growth method, which is continuously performed after the step of forming the first parts.

Preferably, the method further includes the steps of: forming a plurality of trenches, which penetrates the body region and reaches the drift region, wherein the trenches extend in parallel to the repeat direction; forming an insulation film on an inner wall of each trench; and embedding a gate electrode in each trench through the insulation film. The trenches are aligned in parallel together, and the trenches are disposed separately so that the body region is sandwiched between two trench gate electrodes.

Furthermore, a method for manufacturing a semiconductor device includes the steps of: forming a plurality of second parts having a second conductive type, wherein each second part is disposed separately; forming a plurality of first parts having a first conductive type, wherein each first part is disposed between the second parts so that an under drift region including the first and second parts aligned alternately in a repeat direction is provided; forming a semiconductor layer on the under drift region, wherein the semiconductor layer has the first conductive type and an impurity concentration of the semiconductor layer is lower than that of the first part of the under drift region; and doping an impurity having the second conductive type into a part of the semiconductor layer so that the part of the semiconductor layer changes its conductive type from the first conductive type to the second conductive type, wherein the part of the semiconductor layer is disposed on the second part.

The above method provides a semiconductor device having a small on state resistance. Further, the manufacturing cost of the semiconductor device becomes lower. Further, since the device does not have the N type channel region, the potential of the first part is prevented from floating so that the potential of the first part is stable. Thus, the withstand voltage is also stable.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 3:
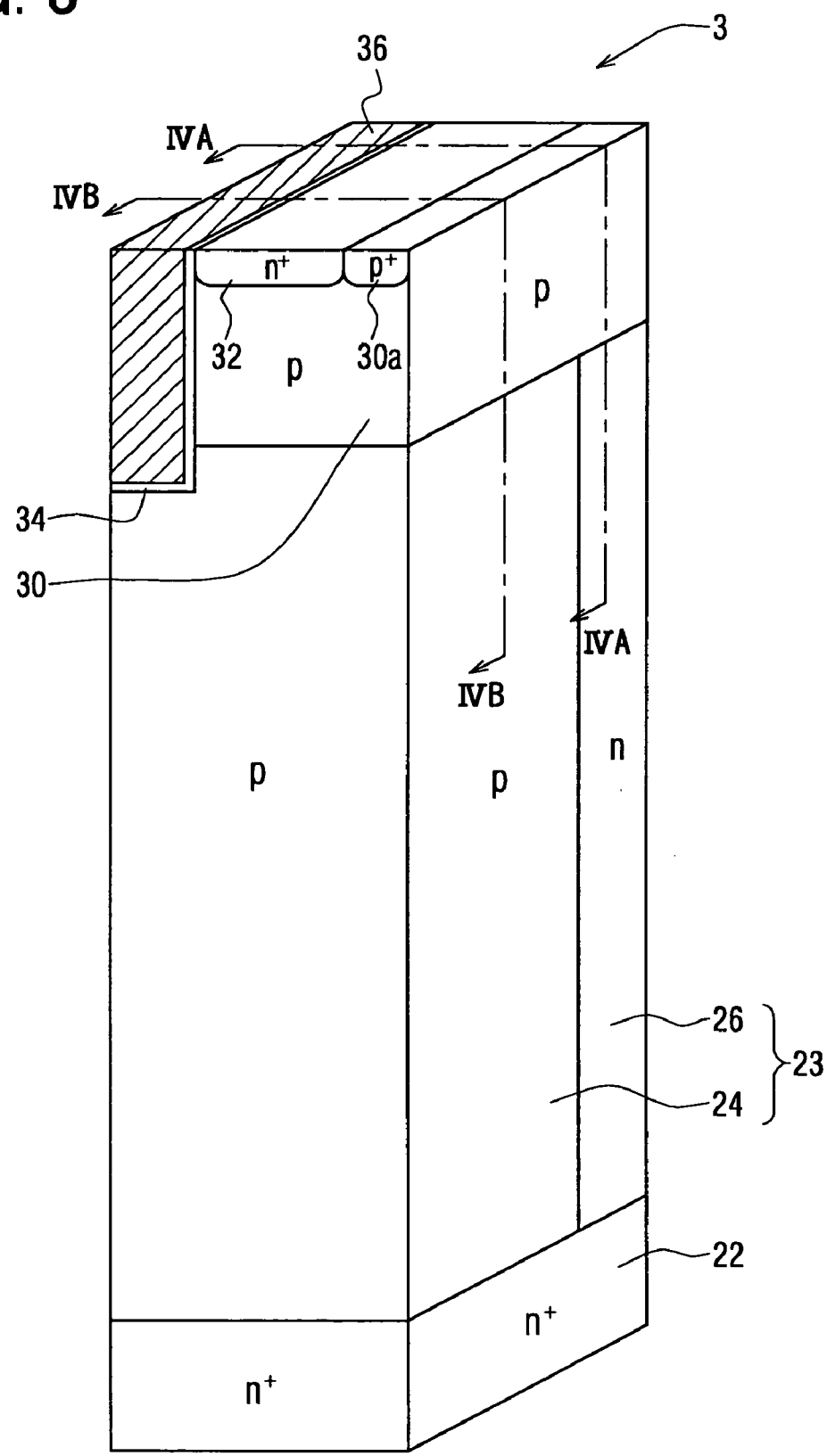
FIG. 3 is a partially enlarged perspective view showing a semiconductor device according to a first embodiment of the present invention.

A semiconductor device 3 with a vertical type MOSFET having a trench gate electrode according to a first embodiment of the present invention is shown in FIG. 3. FIG. 3 shows a pair of a P type column 24 and an N type column 26 as a unit of an alternate layer (i.e., an alternation of strata). The semiconductor device 3 includes a source region 32, a body contact region 30a, a body region 30, a drift region 23, a drain region 22, a trench gate electrode 36 and a gate insulation layer 34. The source region 32 has N type conductivity. The body contact region 30a has P type conductivity. The body region 30 has the P type conductivity, and separates between the source region 32 and the drift region 23. The body contact region 30a contacts the body region 30. The drift region 23 includes the P type column (i.e., the first part) 24 and the N type column (i.e., the second part) 26. The p type column 24 extends between the body region 30 and the drain region 22. The N type column 26 adjacent to the P type column 24 extends between the body region 30 and the drain region 22. A pair of the P type column 24 and the N type column 26 provides a unit of the alternate layer, which is repeated alternately so that the drift region 23 is formed. The drain region 22 has the N type conductivity.

The trench gate electrode 36 penetrates through the body region 30, which separates between the source region 32 and the drift region 23. The trench gate electrode 36 extends toward a repeat direction of the P type column 24 and the N type column 26, so that the trench gate electrode 36 penetrates the alternate layer. The trench gate electrode 36 faces a semiconductor region such as the upside of the source region 32, the body region 30 and the drift region 23.

The drain region 22 is made of an $N^+$ type silicon substrate. The drift region 23 has a super junction construction such that the unit of the alternate layer composed of the P type column 24 and the N type column 26 is repeated alternately. A withstand voltage can be controlled by changing a thickness of the alternate layer in a longitudinal direction. When a value obtained by multiplying the width of the P type column 24 in the repeat direction by the impurity concentration of the P type column 24 is almost equal to a value obtained by multiplying the width of the N type column 26 in the repeat direction by the impurity concentration of the N type column 26, the drift region 23 is completely depleted substantially so that the off state withstand voltage is improved. The impurity concentration of the P type column 24 is set to be equal to or smaller than that of the P type body region 30. In the semiconductor device 3 shown in FIG. 3, the impurity concentration of the P type column 24 is set to be one-fifth of the impurity concentration of the P type body region 30.

Figure 4A:
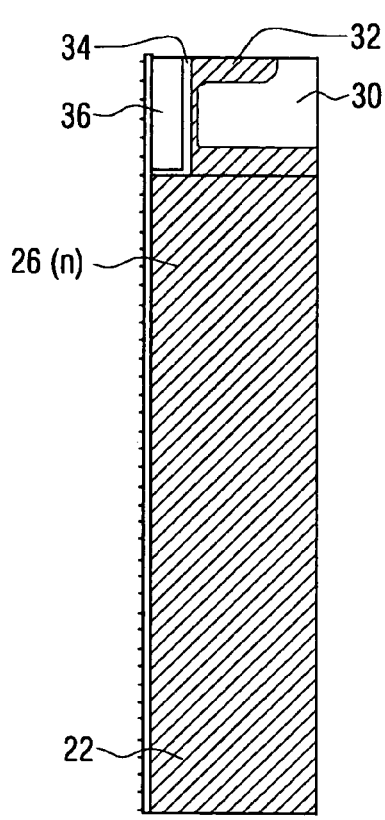
FIG. 4A is a cross sectional view showing the device taken along line IVA-IVA in FIG. 3 when the device is in an on-state.
Figure 4B:
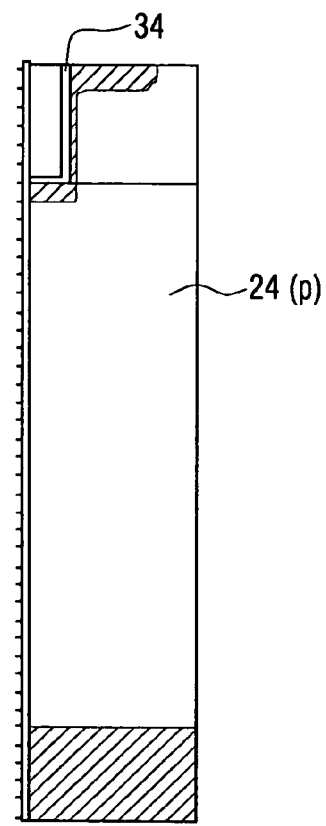
FIG. 4B is a cross sectional view showing the device taken along line IVB-IVB in FIG. 3, according to the first embodiment.
Figure 5A:
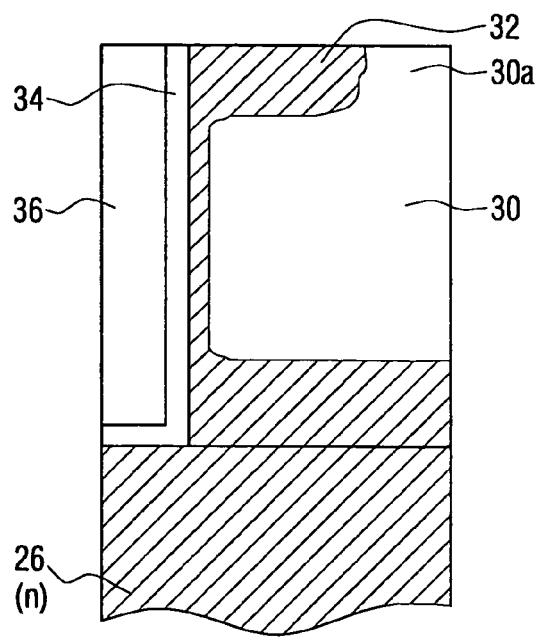
FIG. 5A is a partially enlarged cross sectional view showing the device taken along line IVA-IVA in FIG. 3 when the device is in an on-state.
Figure 5B:
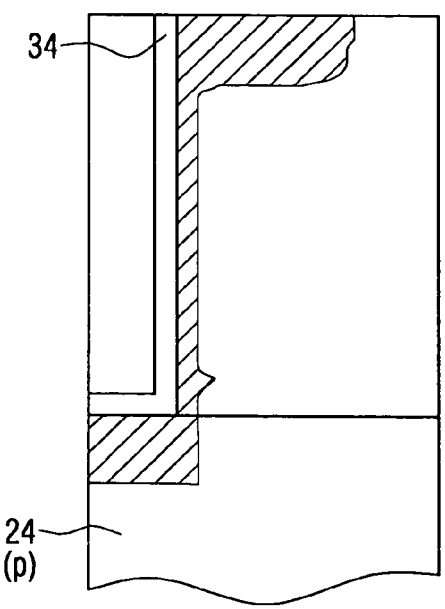
FIG. 5B is a partially enlarged cross sectional view showing the device taken along line IVB-IVB in FIG. 3, according to the first embodiment.

FIG. 4A is a cross sectional view showing a current distribution in a case where the positive voltage is applied to the trench gate electrode 36 so that the body region 30 facing the trench gate electrode 36 is reversed. Specifically, FIG. 4A shows the current distribution of the N type column 26. FIG. 4B shows the current distribution of the P type column 24. FIGS. 5A and 5B are enlarged cross sectional views showing around the trench gate electrode 36. At this time, the bias voltage condition of the semiconductor device 3 is as follows. The source voltage (i.e., Vs) is zero Volts, the drain voltage (i.e., Vd) is 0.1 Volts, and the gate voltage (i.e., Vg) is 15 Volts.

Here, in FIGS. 4A to 7B, the current density of a hatched area is maximum. Therefore, the current mainly flows through the hatched area.

As shown in FIGS. 4A and 5A, the current flows from the $N^+$ type drain region 22, and passes through the N type column 26. Then, the current flows into the $N^+$ type source region 32 through the inversion layer, which is formed in the P type body region 30 and faces the side of the trench gate electrode 36.

As shown in FIGS. 4B and 5B, the current flows from the N type column 26, and branches to flow the upside of the P type column 24 facing the bottom of the trench gate electrode 36. Further, the current flows in the P type body region 30 facing the trench gate electrode 36 and disposed on the P type column 24.

Thus, the current flows from the N type column 26, and passes through the inversion layer of the body region 30 disposed on the P type column 24 and facing the trench gate electrode 36. Therefore, the whole area of the inversion layer in the body region 30 facing the trench gate electrode 36 works as a channel. Thus, the current path is secured widely.

As described later, when the impurity concentration of the P type column 24 becomes higher than that of the P type body region 30, the upside of the P type column 24 facing the bottom of the trench gate electrode 36 does not flow the current. Further, in this case, the current does not flow in the P type body region 30 facing the side of the trench gate electrode 36 and disposed on the P type column 24.

A longitudinal direction (i.e., an extending direction) of the P type column 24 and the N type column 26 is not parallel to a longitudinal direction (i.e., an extending direction) of the trench gate electrode 36 so that they intersect with each other. Specifically, in the semiconductor device 3, the longitudinal direction of the P type column 24 and the N type column 26 is perpendicular to the longitudinal direction of the trench gate electrode 36. Further, the impurity concentration of the P type column 24 is set to be equal to or smaller than that of the P type body region 30. In this case, a channel is formed in the upside of the P type column 24 adjacent to the bottom of the trench gate electrode 36. Another channel is also formed in the P type body region facing the side of the trench gate electrode 36 and disposed on the P type column 24. Thus, the current flows through the channels so that the channel resistance is reduced. In the present embodiment, the specific on state resistance (i.e., Ron) is $0.157\Omega \cdot mm^2$.

In the off state of the semiconductor device 3, the depletion layer expands from the P-N junction surface formed between the P type column 24 and the N type column 26 into both of the P type column 24 and the n type column 26. The expansion of the depletion layer depends on the impurity concentration of each of the P or N type column 24, 26. For example, as the impurity concentration of the P or N type column 24, 26 becomes higher, the expansion of the depletion layer becomes small.

Figure 1:
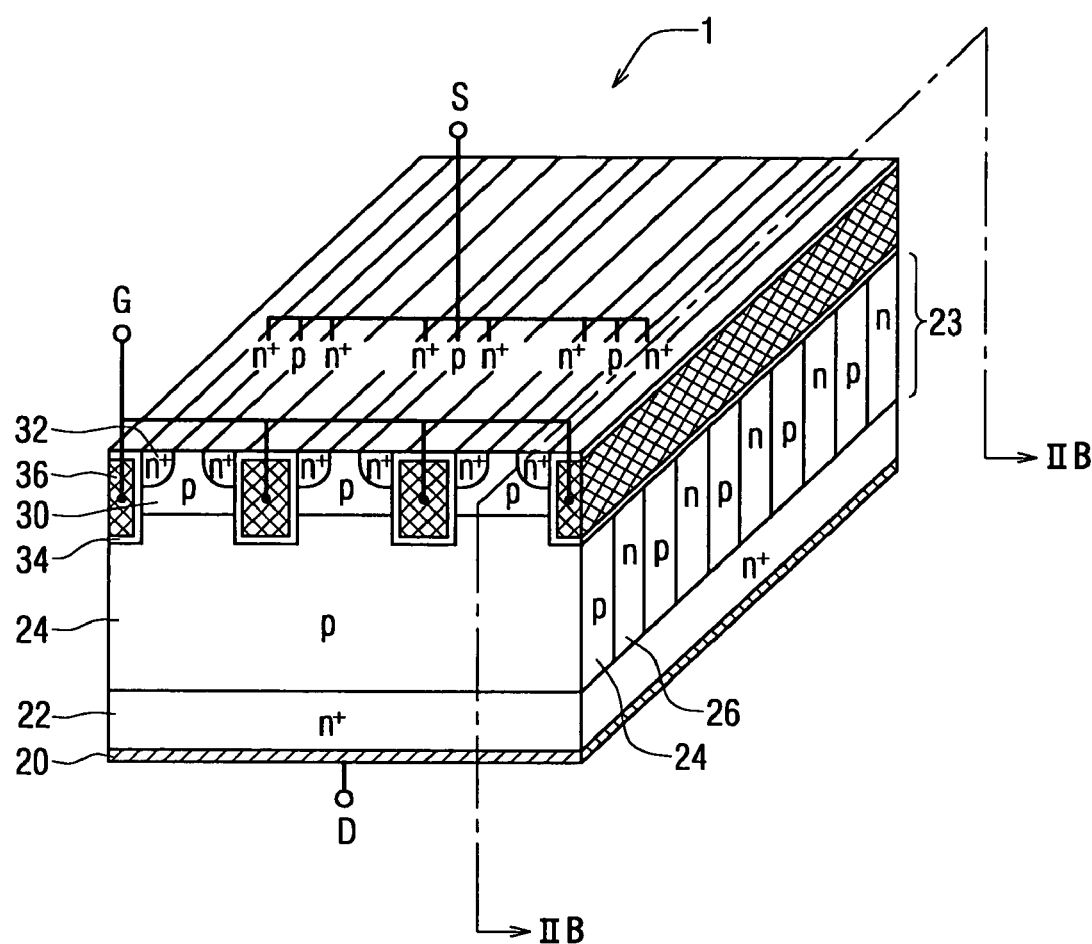
FIG. 1 is a perspective view showing a semiconductor device according to a prior art.
Figure 2A:
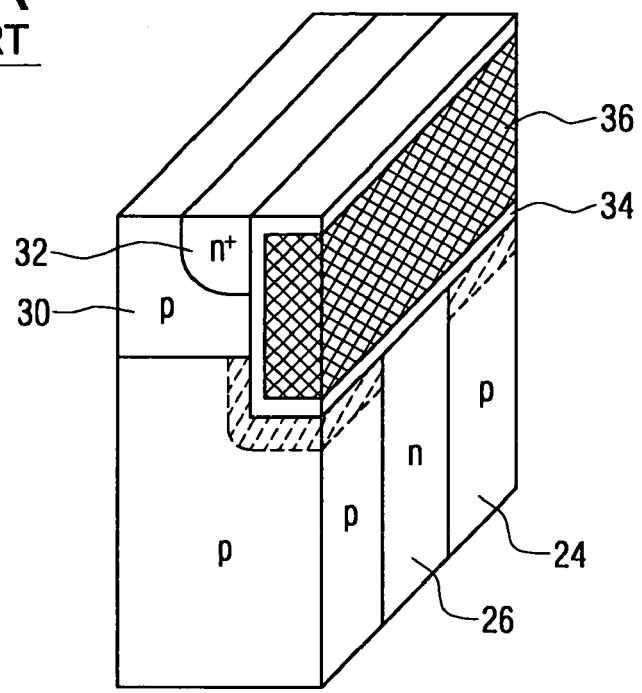
FIG. 2A is a partially enlarged perspective view showing the device.
Figure 2B:
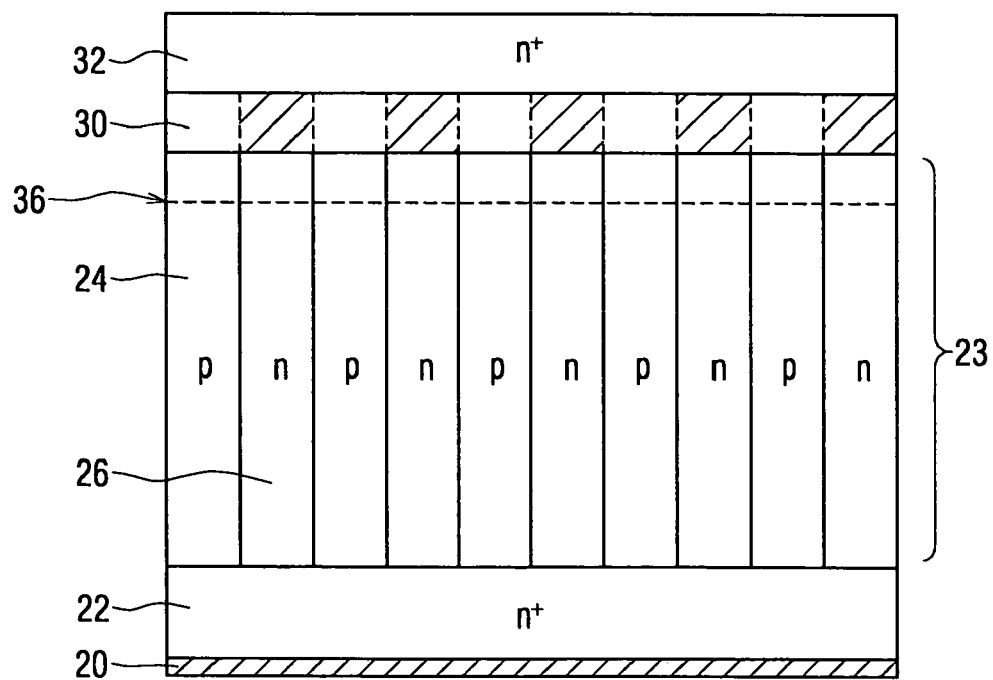
FIG. 2B is a cross sectional view showing the device taken along line IIB-IIB in FIG. 1, according to the prior art.

In the prior art, the drift resistance of the semiconductor device 1 shown in FIG. 1 is reduced by increasing the impurity concentration of the N type column 26. However, in a case where the impurity concentration of the N type column 26 is only increased without increasing the impurity concentration of the P type column 24, it is required that the column width of the P type column 24 becomes wider than that of the N type column 26. This is because the depletion layer expanded in the P type column 24 is required to balance the depletion layer expanded in the N type column 26. Therefore, in the prior art, not only the impurity concentration of the N type column 26 but also the impurity concentration of the P type column 24 are increased so that the column width of the P type column 24 is equalized to that of the N type column 26. Thus, the current path of the N type column 26 is not reduced. IN this case, the impurity concentration of the P type column becomes higher than that of the body region 30.

In the semiconductor device 3 according to the first embodiment, the impurity concentration of the P type column 24 becomes lower than that of the body region 30, so that the on state resistance is reduced. In this case, it is required to reduce the impurity concentration of the N type column 26 or to narrow the column width of the N type column 26 so that the cross sectional area of the N type column 26 is reduced. Therefore, the drift resistance is not reduced (i.e., increased). However, when the impurity concentration of the P type column 24 becomes lower than that of the body region 30, the channel resistance is much reduced so that the total on state resistance is decreased. This reason is described as follows. In a case where the impurity concentration of the P type column 24 is lower than that of the body region 30, the body region 30 facing the trench gate electrode 36 is reversed, and further, the P type column 24 facing the trench gate electrode 36 is also reversed. The inversion layer of the P type column 24 facing the trench gate electrode 36 is disposed between the inversion layer of the body region 30 facing the trench gate electrode 36 and disposed on the P type column 24 and the N type column 26. When the P type column 24 facing the trench gate electrode 36 is reversed, the inversion layer of the body region 30 facing the trench gate electrode 36 and disposed on the P type column 24 can work as a channel. Thus, the channel resistance is reduced.

Accordingly, in the semiconductor device 3, the channel resistance is reduced without increasing an additional part such as the N type channel region in the semiconductor device according to the prior art. Therefore, the manufacturing cost of the semiconductor device 3 becomes lower. Further, since the device 3 does not have the N type channel region, the potential of the P type column is prevented from floating so that the potential of the P type column is stable. Thus, the withstand voltage is also stable.

Although the body region 30, the body contact region 30a, and the P type column (i.e., the first part) have the P type conductivity, and the source region 32, the N type column (i.e., the second part), and the drain region 22 have the N type conductivity, each part of the device 3 can have inverse type conductivity. Specifically, the body region 30, the body contact region 30a, and the P type column (i.e., the first part) have the N type conductivity, and the source region 32, the N type column (i.e., the second part), and the drain region 22 have the P type conductivity.

Although the impurity concentration of whole area of the P type column 24 is equal to or lower than that of the body region 30, the impurity concentration of at least a part of the P type column 24 can be equal to or lower than that of the body region 30. The part of the P type column 24 is disposed near the trench gate electrode 36. Specifically, the part of the P type column 24 faces the trench gate electrode 36 and has predetermined dimensions, in which the channel is formed.

Preferably, the impurity concentration of the other part of the P type column 24 is lower than that of the body region 30. In this case, since the impurity concentration of the part of the P type column 24 disposed near the trench gate electrode 36 is low, the part of the P type column 24 is reversed so that the inversion layer of the body region 30 facing the trench gate electrode 36 and disposed on the P type column 24 can work as a channel. Thus, the channel resistance is reduced. Further, since the impurity concentration of the other part of the P type column 24 is high, the drift resistance is also reduced. Thus, both of the channel resistance and the drift resistance are reduced.

Although the P type column 24 contacts the N type column 26 directly, the P type column 24 can contact the N type column 26 through an insulation layer. Although the trench gate electrode 36 penetrates the body region 30 and extends inside of the drift region 23, the trench gate electrode 36 is not required to extend inside of the drift region 23 as long as the trench gate electrode 36 reaches the drift region 23.

Although the trench gate electrode 36 extends in parallel to the repeat direction of the P type and N type columns 24, 26, the trench gate electrode 36 can cross the repeat direction with a predetermined angle. Specifically, the trench gate electrode 36 can be cross the repeat direction at a slant.

Although the device 3 includes the source region 32 and the drain region 22, it is not necessary for the device 3 to include the source region 32 and/or the drain region 22. In this case, the device 3 only includes the body region 30, the drift region 23 and the trench gate electrode 36.

Second Embodiment

Figure 6A:
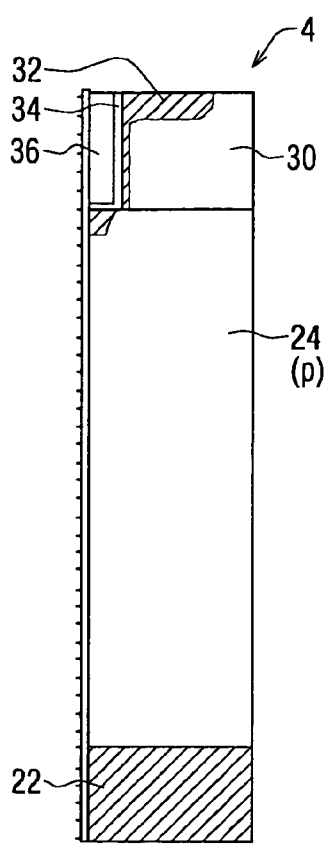
FIG. 6A is a cross sectional view showing a semiconductor device when the device is in an on-state.
Figure 6B:
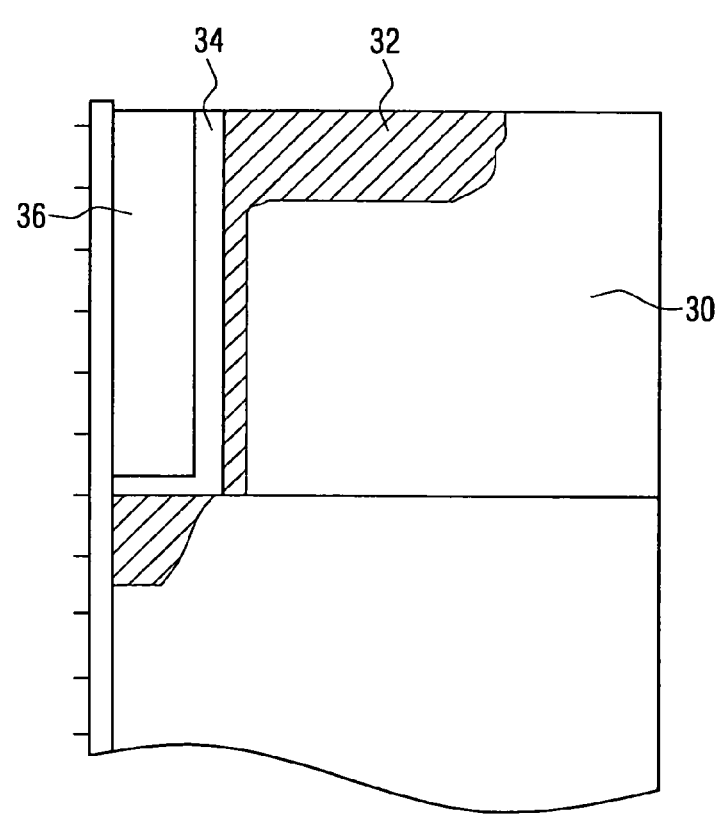
FIG. 6B is a partially enlarged cross sectional view showing the device according to a second embodiment of the present invention.

FIGS. 6A and 6B shows another semiconductor device 4 according to a second embodiment of the present invention. The semiconductor device 4 has the same construction as the semiconductor device 3 shown in FIG. 3. However, in the semiconductor device 4, the impurity concentration of the P type column 24 is equal to the impurity concentration of the P type body region 30.

FIG. 6A shows the current distribution of the P type column 24. FIG. 6B is an enlarged cross sectional view showing around the trench gate electrode 36. At this time, the bias voltage condition of the semiconductor device 4 is as follows. The source voltage (i.e., Vs) is zero volts, the drain voltage (i.e., Vd) is 0.1 Volts, and the gate voltage (i.e., Vg) is 15 Volts.

As shown in FIG. 6B, the current flows from the N type column 26, and branches to flow the upside of the P type column 24 facing the bottom of the trench gate electrode 36. Further, the current also flows in the P type body region 30 facing the side of the trench gate electrode 36 and disposed on the P type column 24. However, the current density in the semiconductor device 4 is smaller than that in the semiconductor device 3. Thus, as the impurity concentration of the P type column 24 is lower, the current path extends in a large area of the inversion layer (i.e., the channel). However, when the impurity concentration of the P type column 24 is equal to or smaller than that of the P type body region 30, the inversion layer is formed in the P type column 24 so that the inversion layer of the body region 30 disposed on the P type column 24 works as a current path. Therefore, it is important to set the impurity concentration of the P type column 24 to be equal to or smaller than that of the P type body region 30.

In the present embodiment, the specific on state resistance (i.e., Ron) is $0.195\Omega\cdot mm^2$.

Figure 7A:
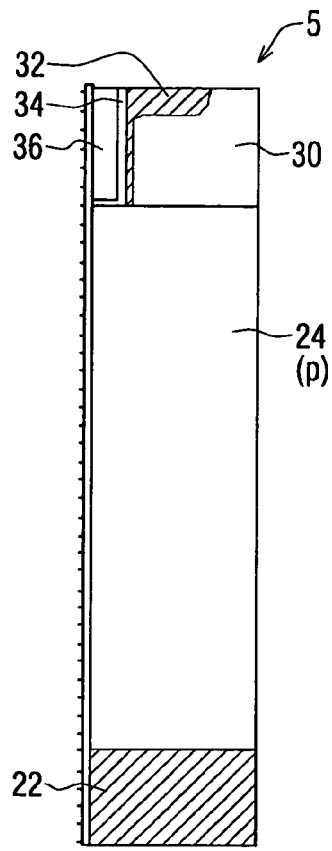
FIG. 7A is a cross sectional view showing a semiconductor device as a comparison when the device is in an on-state.
Figure 7B:
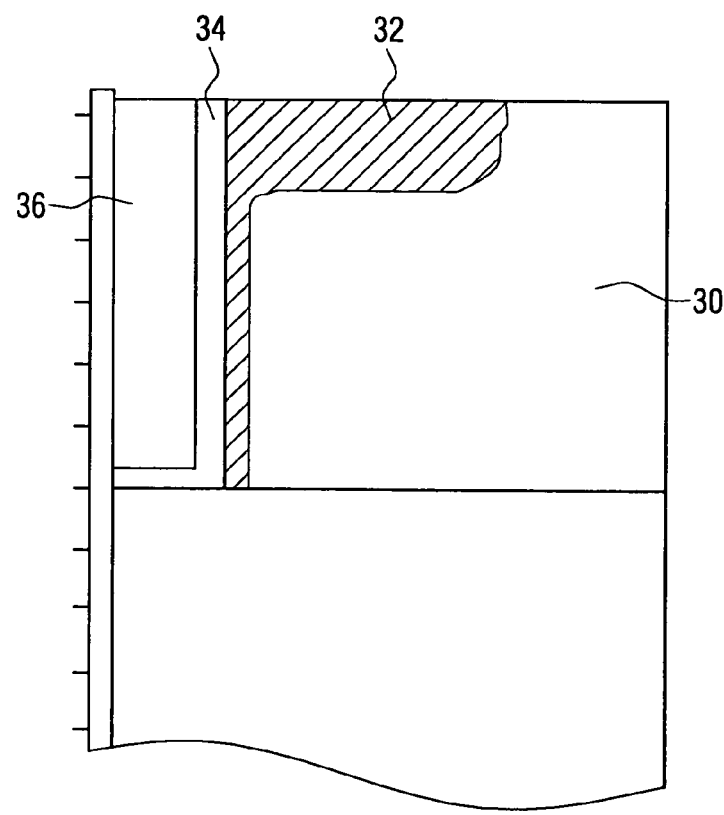
FIG. 7B is a partially enlarged cross sectional view showing the device according to a comparison of the second embodiment.

Here, another semiconductor device 5 as a comparison of the semiconductor device 4 is shown in FIGS. 7A and 7B. The semiconductor device 5 has the same construction as the semiconductor device 3 shown in FIG. 3. However, in the semiconductor device 5, the impurity concentration of the P type column 24 is larger than the impurity concentration of the P type body region 30.

FIG. 7A shows the current distribution of the P type column 24. FIG. 7B is an enlarged cross sectional view showing around the trench gate electrode 36. At this time, the bias voltage condition of the semiconductor device 5 is as follows. The source voltage (i.e., Vs) is zero Volts, the drain voltage (i.e., Vd) is 0.1 Volts, and the gate voltage (i.e., Vg) is 15 Volts. As shown in FIG. 7B, the current path is not formed on the upside of the P type column 24 facing the bottom of the trench gate electrode 36. Here, in the semiconductor devices 3, 4, the current path is formed in the upside of the P type column 24 facing the bottom of the trench gate electrode 36. Thus, in the semiconductor device 5, no channel is formed there. Therefore, the current does not flow in the P type body region 30 facing the side of the trench gate electrode 36 through the upside of the P type column 24 facing the bottom of the trench gate electrode 36. Therefore, in a case where the impurity concentration of the P type column 24 is higher than that of the P type body region 30, the current path cannot be secured widely.

In the comparison device 5, the specific on state resistance (i.e., Ron) is $0.214\Omega\cdot mm^2$, which is about 36% larger than that in the semiconductor device 3 shown in FIG. 3.

Accordingly, it is important to set the impurity concentration of the first part (i.e., the P type column) 24 in the drift region 23 to be equal to or smaller than that of the body region 30.

The on state resistance in the semiconductor devices 3, 4 shown in FIGS. 3, 6A and 6B is the sum of the channel resistance formed around the trench gate electrode 36, the drift resistance, i.e., the resistance of the N type column 26 and the resistance of the N⁺ type drain region 22. The drift resistance constitutes a large percentage of the on state resistance of the semiconductor devices 3, 4. The drift resistance is determined by both of the impurity concentration of the N type column 26 and the depth of the N type column 26. The depth of the N type column 26 is a length between the P type body region 30 and the N⁺ type drain region 22. For example, when the depth of the drift region 23 is set to a certain depth in order to set the withstand voltage to 200 Volts, the drift resistance (i.e., the resistance of the N type column 26 as a drift region) constitutes about 85% of the on state resistance.

When the withstand voltage is low, the depth of the drift region 23 becomes shallow. Thus, the percentage of the drift resistance constituting in the on state resistance is reduced. This shows that the percentage of the channel resistance constituting in the on state resistance is increased. In the semiconductor devices 3, 4, the current path extends in a wide area of the channel so that the channel resistance is reduced. Therefore, when the withstand voltage is low, i.e., when the depth of the drift region 23 in the super junction construction is shallow, the reduction of the on state resistance becomes more effective. Further, in the semiconductor device 4, a floating potential state is prevented from occurring, so that the characteristic of the withstand voltage is stabilized.

When the power MOSFET having the super junction construction is manufactured according to a prior art, a crystal growth process for forming the P type column 24 is performed independently from a crystal growth process for forming the P type body region 30. Here, in general, the P type column 24 is formed by an epitaxial growth method. This is because the impurity concentration of the P type column 24 is different from that of the P type body region 30. Specifically, the impurity concentration of the P type column 24 is determined such that the P type column 24 can be completely depleted substantially. The impurity concentration of the P type body region 30 is determined such that the trench gate electrode 36 has a predetermined threshold voltage.

However, in the semiconductor device 4 shown in FIGS. 6A and 6B, even when the impurity concentration of the P type column 24 is equal to that of the P type body region 30, the on state resistance is reduced. Therefore, the crystal growth process for forming the P type column 24 and the crystal growth process for forming the P type body region 30 can be performed continuously. Thus, the manufacturing process can be simplified. Specifically, each N type column 26 is formed separately so that a space therebetween is formed. In the space, the P type column 24 is formed by the epitaxial growth method so that the P type column 24 is embedded in the space. Thus, the drift region 23 is formed. Successively, the epitaxial growth is continued so that the P type body region 30 is formed on the drift region 23.

In the above method for performing the process for forming the P type column 24 and the process for forming the P type body region 30 successively, it is preferred that the column width of the P type column 24 is equal to or narrower than 1 µm. In general, to deplete the P type column 24 completely, it is preferred that the value obtained by multiplying the impurity concentration of the P type column 24 by the column width of the P type column 24 is equal to or smaller than $1 \times 10^{12}$ cm⁻³. In this case, the P type column 24 is completely depleted substantially. The impurity concentration of the P type body region 30 is determined by the threshold voltage of the trench gate electrode 36 so that the impurity concentration is set to be in a range between $1 \times 10^{16}$ cm⁻³ and $1 \times 10^{17}$ cm⁻³. Therefore, when the column width of the P type column 24 is equal to or narrower than 1 µm, the impurity concentration of the P type column 24 can be set to be equal to or higher than $1 \times 10^{16}$ cm⁻³. Therefore, the impurity concentration of the P type column 24 can be equalized to that of the P type body region 30. Thus, the process for forming the P type column 24 and the process for forming the P type body region 30 can be performed successively.

Third Embodiment

Figure 8:
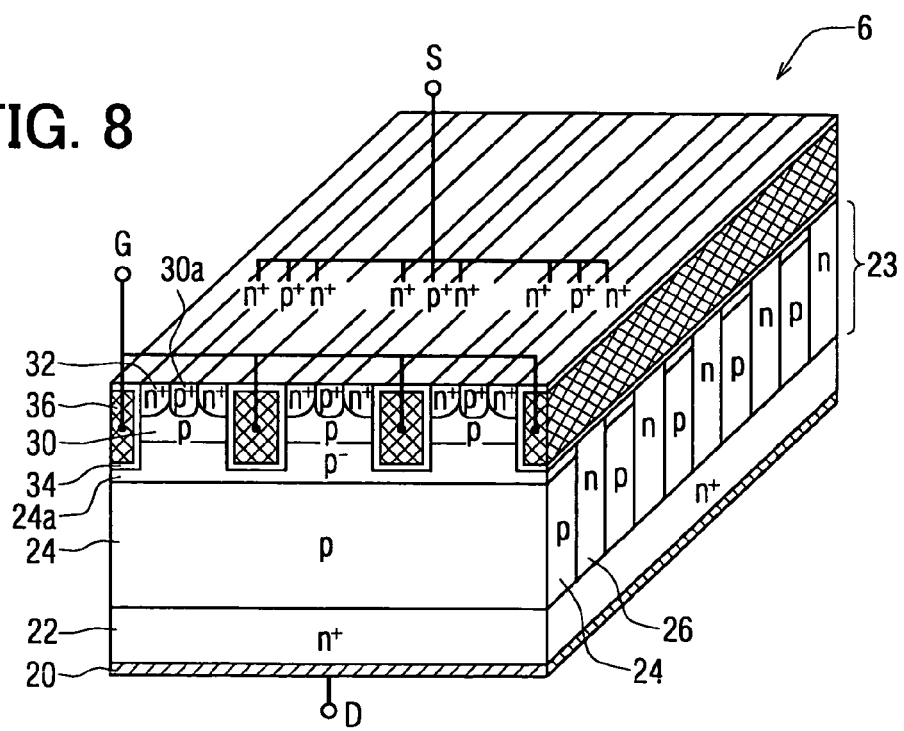
FIG. 8 is a perspective view showing a semiconductor device according to a third embodiment of the present invention.

A semiconductor device 6 according to a third embodiment of the present invention is shown in FIG. 8. The device 6 has the vertical type MOSFET with the trench gate electrode. The semiconductor device 6 includes the source region 32, the body region 30, the drift region 23, the drain region 22, the trench gate electrode 36 and the gate insulation layer 34. The source region 32 has the N type conductivity. The body contact region 30a has the P type conductivity, and separates between the source region 32 and the-drift region 23. The body contact region 30a contacts the P type body region 30. The impurity concentration of a part of the P type column 24 disposed on the P type body region side is equal to or smaller than that of the P type body region 30. The part of the P type column 24 represents as a P⁻ type region 24a in FIG. 8. The impurity concentration of other part of the P type column 24 except for the P⁻ type region 24a is equal to or larger than that of the P type body region 30. The drain region 22 has the N type conductivity.

Next, an operation of the semiconductor device 6 is described as follows. A predetermined positive voltage is applied to the drain electrode 20, and both of the N⁺ type source region 32 and the P type body region 30 are grounded. Then, another predetermined positive voltage is applied to the trench gate electrode 36, so that the current flows from the N⁺ type drain region 22 to the N⁺ type source region 32. Specifically, when the positive voltage is applied to the trench gate electrode 36, electrons in the P type body region 30 are concentrated to a portion facing the trench gate electrode 36 so that an N type channel is formed. Electrons in the P⁻ type region 24a is concentrated to a portion facing the bottom of the trench gate electrode 36 so that another N type channel region is formed. Thus, the electrons supplied from the N⁺ type source region 32 flow through the P type body region 30 and the P⁻ type region 24a. Specifically, the electrons flow through the N type channel of the P type body region 30, which is disposed on the P type column 24 and faces the side of the trench gate electrode 36, and the portion of the P⁻ type region 24a facing the bottom of the trench gate electrode 36. Then, the electrons flow through the N type column 26, and reach the N⁺ type drain region 22.

Preferably, the P⁻ type region 24a is formed in a portion including the N type channel of the p type column 24. In this case, the N type channel is easily formed when the positive voltage is applied to the trench gate electrode 36.

One of the characteristics in the semiconductor device 6 is such that the P⁻ type region 24a is formed on the P type column 24. Therefore, the impurity concentration of a portion of the P type column 24 adjacent to the trench gate electrode 36 can be set to be lower than that of the P type body region 30. Specifically, the impurity concentration of the P⁻ type region 24a is lower than that of the P type body region 30. Therefore, the impurity concentration of the P type column 24 except for the P⁻ type region 24a can be set to be comparatively higher independently from the impurity concentration of the P type body region 30. Thus, the column width of the P type column 24 can be narrowed. Therefore, it is not necessary to narrow the column width of the N type column 26, so that the cross sectional area of the N type column 26 does not become smaller. Specifically, a proportion of the cross sectional area of the N type column 26 in the whole area of the drift region 23 does not reduced substantially. Therefore, the column width of the N type column 26 can be widened, and the impurity concentration of The N type column 26 can become higher. Thus, the on state resistance of the N type column 26 is much reduced.

Further, in the semiconductor device 6, a floating potential state is prevented from occurring, so that the characteristic of the withstand voltage is stabilized.

Further, the process for forming the P type column 24 and the process for forming the P type body region 30 can be performed successively.

Furthermore, since the P⁻ type region 24a is formed, the channel resistance is reduced. Further, the on state resistance of the N type column 26 is also reduced.

Next, two different methods for manufacturing the semiconductor device 6 are described as follows with reference to the drawings of FIGS. 9 to 17.

[First Method]

Figure 9:
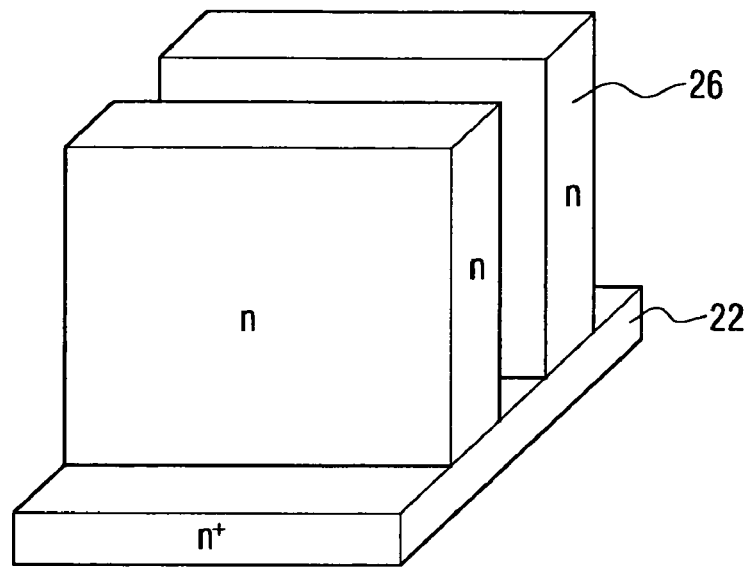
FIG. 9 is a perspective view explaining a first method for manufacturing the device according to the third embodiment.

The first method for manufacturing the semiconductor device 6 is shown in FIGS. 9 to 15. As shown in FIG. 9, at first, multiple N type columns 26 are formed on the N⁺ type drain region 22 to separate each other. Specifically, an N type semiconductor crystal layer is formed on the N⁺ type drain region 22 by the epitaxial method. Then, multiple grooves are formed in the N type semiconductor crystal layer by a dry etching method such as RIE (i.e., reactive ion etching) method, so that the N type columns 26 are formed to separate each other.

Figure 10:
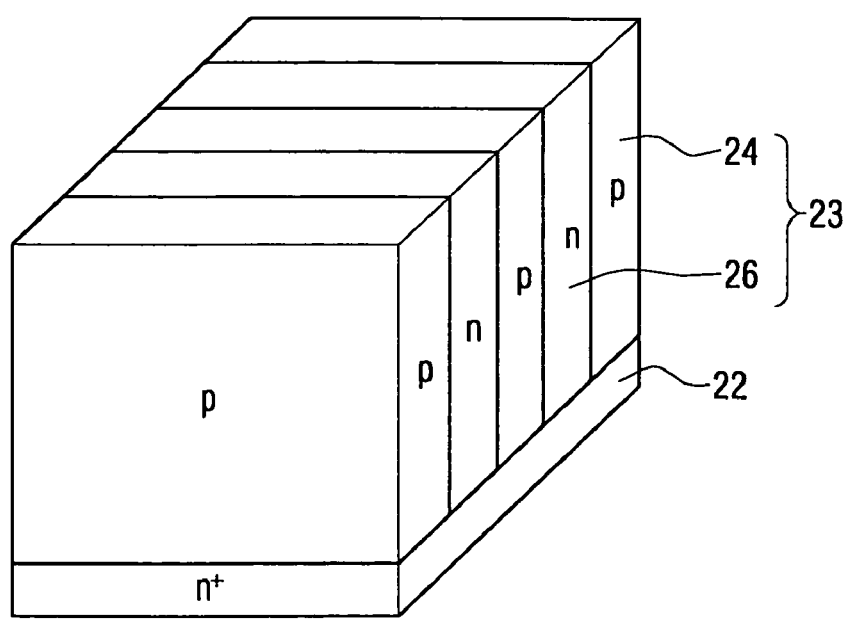
FIG. 10 is a perspective view explaining the first method for manufacturing the device according to the third embodiment.

Then, as shown in FIG. 10, the P type column 24 is formed and embedded in a space (i.e., the groove) between the N type columns 26 by the epitaxial method. Thus, the super junction construction, which has the P type column 24 and the N type column 26 repeated alternately, is formed. Here, the super junction construction can be formed by other methods such as a slanting ion implantation method (i.e., ISPSD 2000, Pages 77-80), a multiple epitaxial method (i.e., IEDM 1998, Pages 683-685) and an embedded epitaxial method (i.e., ISPSD 2001, Pages 363-366). The ISPSD 2000 is the proceedings of the eleventh international symposium on power semiconductor device. The ISPSD 2001 is the proceedings of the twelfth international symposium on power semiconductor device. The IEDM 1998 is the proceedings of the international electron device meeting, 1998.

Figure 11:
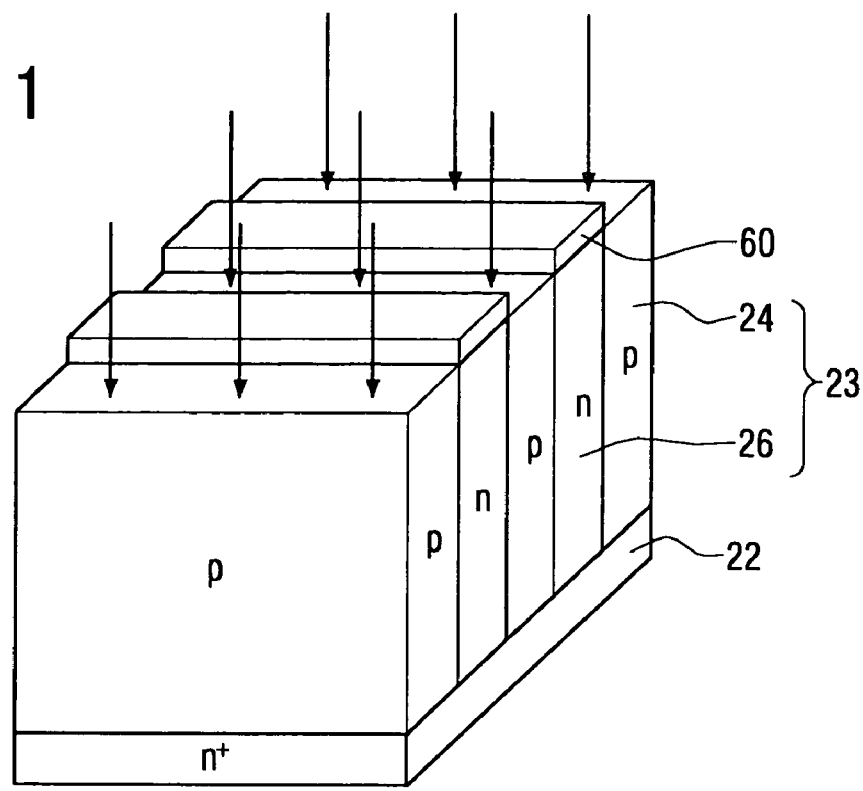
FIG. 11 is a perspective view explaining the first method for manufacturing the device according to the third embodiment.
Figure 12:
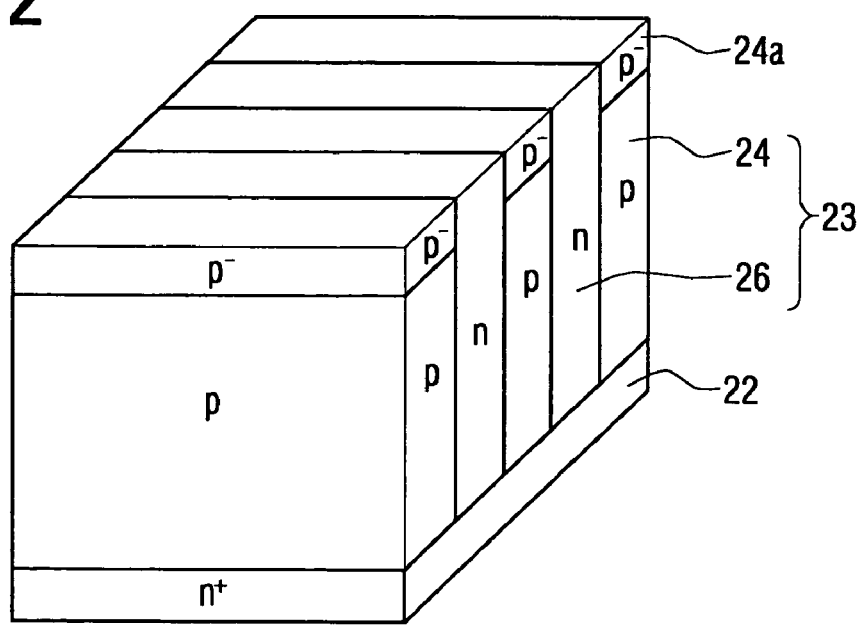
FIG. 12 is a perspective view explaining the first method for manufacturing the device according to the third embodiment.

Next, as shown in FIG. 11, a mask 60 is formed on the N type column 26. Specifically, a photo resist film is applied on the drift region 23. Then, a part of the photo resist film is removed by a photo lithography method so that the surface of the P type column 24 is exposed from the photo resist film. Thus, the mask 60 is formed. Then, a predetermined amount of an N type impurity is doped to the exposed P type column 24 so that the P type impurity concentration in the upside of the P type column 24 is reduced. The above doping is a counter doping. Then, a process for annealing (i.e., a process of thermal treatment) is performed so that the doped impurity is activated. Then, the mask 60 is removed by the etching. Thus, the P⁻ type region 24a is formed on the P type column 24. The impurity concentration of the P⁻ type region 24a is lower than that of the P type column 24. Here, the counter doping is performed, i.e., the N type impurity is doped in the P type column 24 till the impurity concentration of the P⁻ type region 24a becomes lower than that of the P type body region 30.

Figure 13:
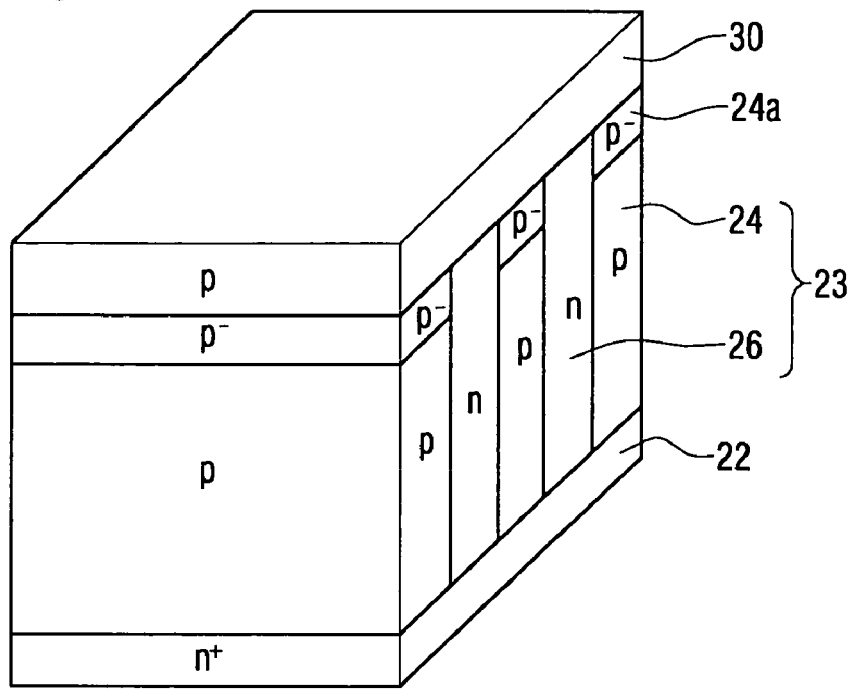
FIG. 13 is a perspective view explaining the first method for manufacturing the device according to the third embodiment.
Figure 14:
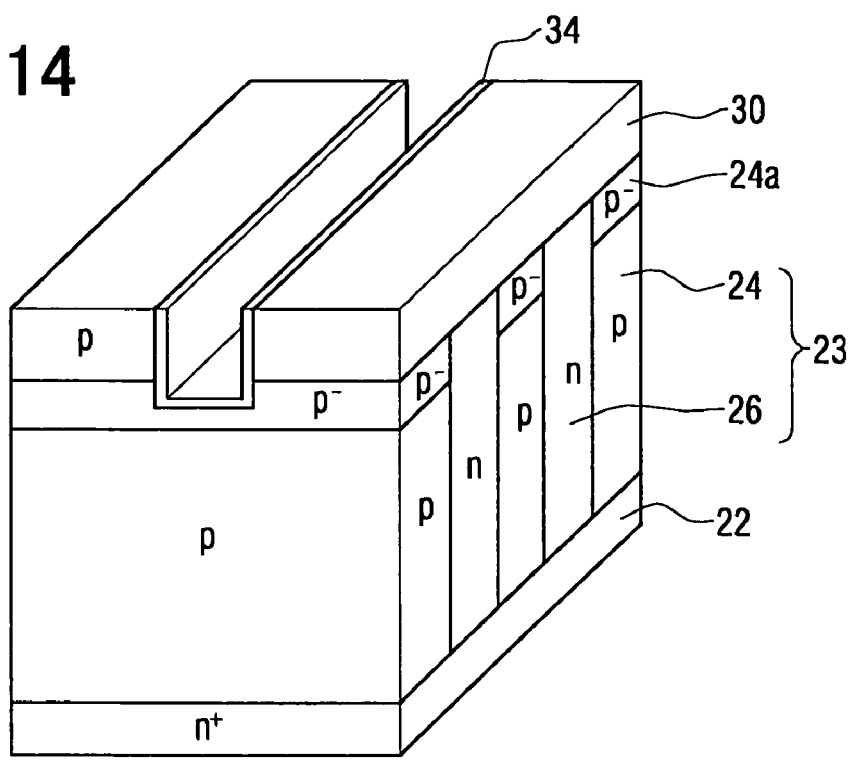
FIG. 14 is a perspective view explaining the first method for manufacturing the device according to the third embodiment.

As shown in FIG. 13, a P type crystal layer is formed on both surfaces of the P⁻ type region 24a and the N type column 26 by the epitaxial method until the P type crystal layer has a predetermined thickness, which is required to form the body region 30. Thus, the P type body region 30 is formed. The impurity concentration of the P type body region 30 is determined uniquely from the threshold voltage of the trench gate electrode 36. The following processes are a process for forming the trench gate electrode 36. As shown in FIG. 14, a trench is formed in the P type body region 30. The trench penetrates the P type body region 30, and reaches the P⁻ type region 24a. The depth of the trench is shallower than the bottom of the P⁻ type region 24a. Specifically, a photo resist film is applied on the surface of the P type body region 30. Then, a part of the photo resist film is removed by the photo lithography method, so that a trench-to-be-formed portion of the surface of the P type body region 30 is exposed from the photo resist. The trench-to-be-formed portion is formed to be parallel to the repeat direction of the P type column 24 and the N type column 26. This direction is perpendicular to an extending direction of the P type column 24 and the N type column 26. Next, the surface of the exposed P type body region 30 is etched and removed by the dry etching method such as RIE method, which is an anisotropic etching method, until the thickness of the P type body region 30 becomes a predetermined thickness. In the semiconductor device 6 according to the present embodiment, the depth of the trench is such that the trench penetrates the P type body region 30 and the trench does not penetrate the P⁻ type region 24a. Thus, the trench is formed. Then, the gate insulation layer 34 is formed on the sidewall of the trench by the thermal oxidation method, the CVD (i.e., chemical vapor deposition) method or the like.

Figure 15:
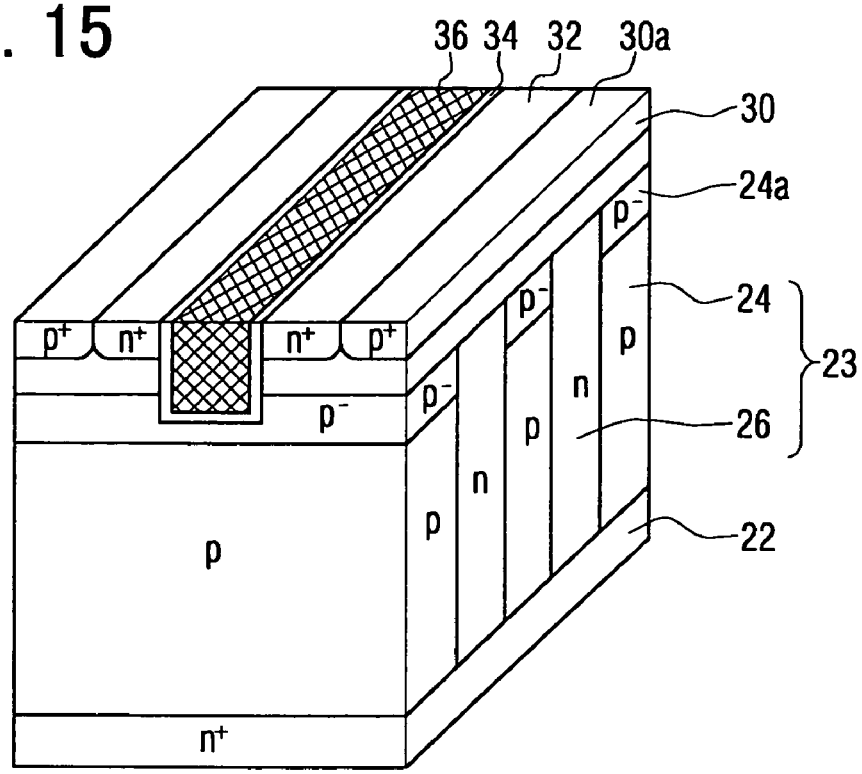
FIG. 15 is a perspective view explaining the first method for manufacturing the device according to the third embodiment.

Next, as shown in FIG. 15, an electrode material such as poly silicon or the like is deposited in the trench by the CVD method or the like so that the trench gate electrode 36 is formed. Then, an N type impurity is implanted (i.e., doped) in a region disposed near the side of the trench and disposed on the P type body region 30. The region doped with the N type impurity becomes the N⁺ type source region 32. Further, a P type impurity is implanted (i.e., doped) in a region disposed adjacent to the N-type-source-region-to-be-formed region and on the P type body region 30. The region doped with the P type impurity becomes the P⁺ type body contact region 30a. Thus, the semiconductor device 6 is completed.

[Second Method]

Figure 16:
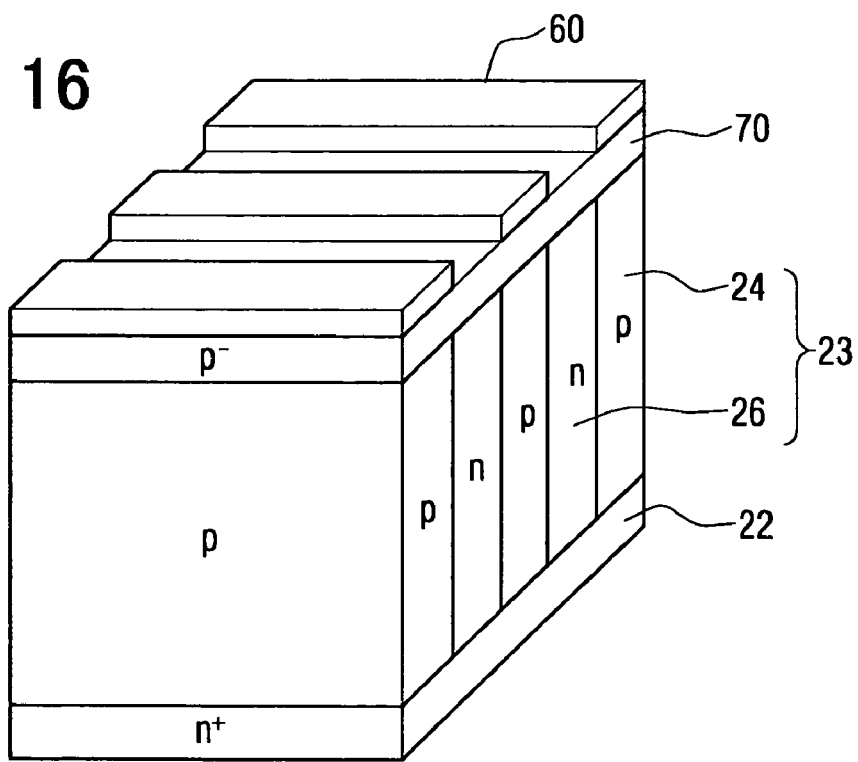
FIG. 16 is a perspective view explaining a second method for manufacturing the device according to the third embodiment.
Figure 17:
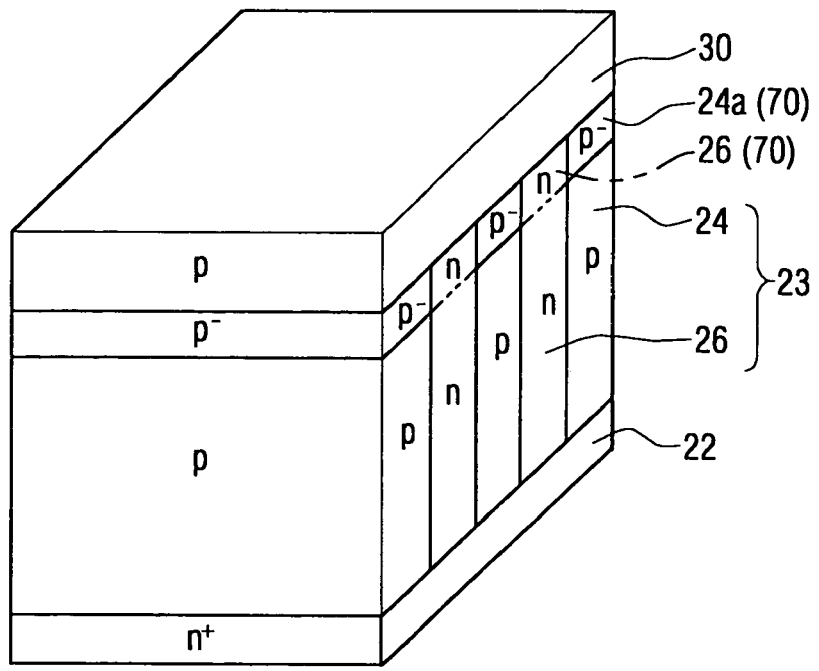
FIG. 17 is a perspective view explaining the second method for manufacturing the device according to the third embodiment.

The second method for manufacturing the semiconductor device 6 is shown in FIGS. 16 and 17. The super junction construction having the P type column 24 and the N type column 26 repeated alternately is formed by the same manner as the first method. Next, as shown in FIG. 16, a P⁻ type semiconductor thin film 70 is deposited on both of the P type column 24 and the N type column 26, i.e., on the drift region 23 by the epitaxial growth method such as the CVD method. The impurity concentration of the P⁻ type semiconductor thin film 70 is lower than that of the P type column 24. Next, a photo resist film is applied on the P⁻ type semiconductor thin film 70. Then, a part of the photo resist corresponding to the N type column 26 is removed by the photo lithography. Thus, the mask 60 is formed on the P type semiconductor thin film 70, which corresponds to the P type column 24. Next, an N type impurity is doped (i.e., implanted) in the exposed P⁻ type semiconductor thin film 70. The ion implantation is performed until the conductive type of the exposed P⁻ type semiconductor thin film 70 corresponding to the N type column 26 changes from the P type to the N type. Further, the ion implantation is performed until the N type impurity concentration of the semiconductor thin film 70 is equalized to the impurity concentration of the N type column 26.

Thus, the doped P⁻ type semiconductor thin film 70 becomes a part of the N type column 26. Further, the un-doped P⁻ type semiconductor thin film 70, which is disposed under the mask 60 and is not implanted with the N type impurity, becomes the P⁻ type region 24a. Next, the mask 60 is etched and removed. Then, a P⁻ type crystal film is deposited by the epitaxial method such as the CVD method or the like so that the P type body region 30 is formed. After that, the trench gate electrode 36 is formed by the same manner as the first method. Thus, the semiconductor device 6 is completed.

Fourth Embodiment

Figure 18:
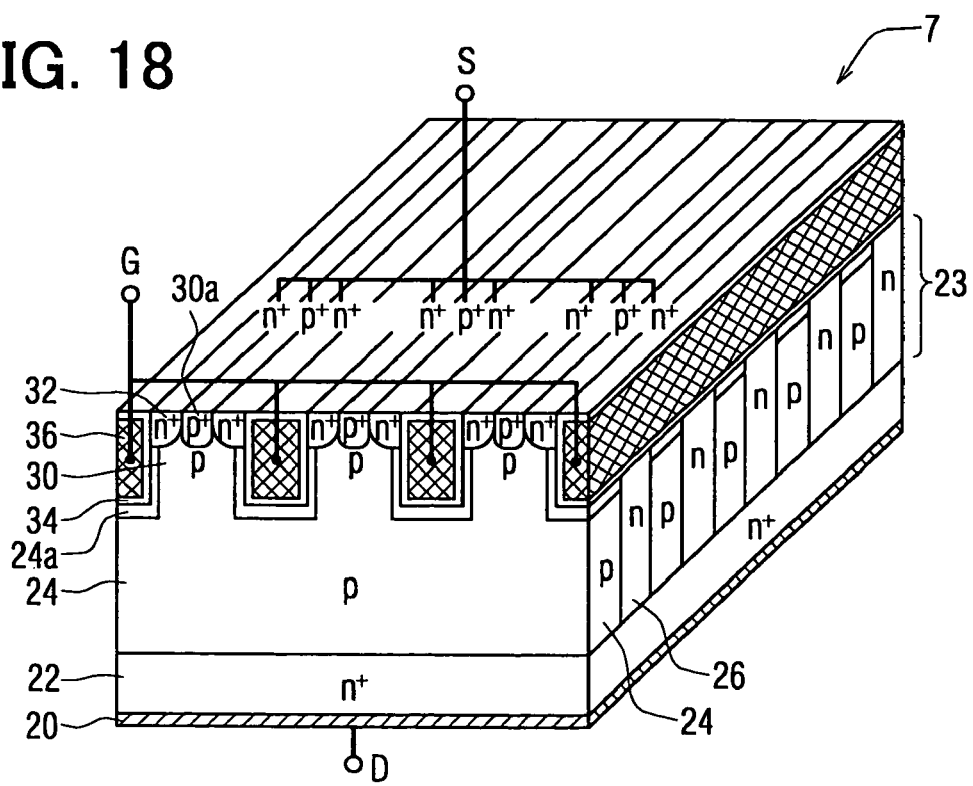
FIG. 18 is a perspective view showing a semiconductor device according to a fourth embodiment of the present invention.

A semiconductor device 7 according to a fourth embodiment of the present invention is shown in FIG. 18. The device 7 has the vertical type MOSFET with the trench gate electrode. As shown in FIG. 18, the P⁻ type region 24a surrounds both of the side and the bottom of the trench gate electrode 36. In this case, the portion facing both of the side and the bottom of the trench gate electrode 36 is covered with the P⁻ type region 24a. Specifically, the portion facing the side of the trench gate electrode 36 and disposed just above the P type column 24 constitutes the P type region 24a. Here, in the semiconductor device 6 shown in FIG. 8, the above portion constitutes the p type body region 30. Therefore, when the positive voltage is applied to the trench gate electrode 36, the above portion of the P⁻ type region 24a also works as the N type channel.

In the semiconductor device 7, the proportion of the cross sectional area of the N type column 26 in the whole area of the drift region 23 does not reduced substantially. Therefore, the column width of the N type column 26 can be widened, and the impurity concentration of the N type column 26 can become higher. Thus, the on state resistance of the N type column 26 is much reduced.

Further, the process for forming the P type column 24 and the process for forming the P type body region 30 can be performed successively.

Figure 19:
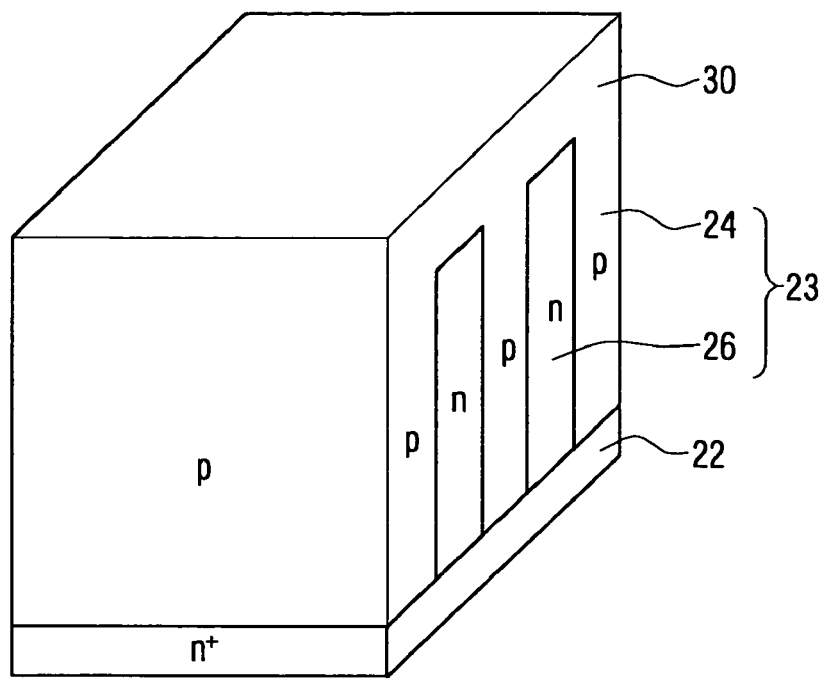
FIG. 19 is a perspective view explaining a method for manufacturing the device according to the fourth embodiment.

Next, a method for manufacturing the semiconductor device 7 is described as follows with reference to the drawings of FIGS. 19 to 21. As shown in FIG. 19, the P type column 24 is embedded and deposited in the space between the N type columns 26 disposed separately each other by the epitaxial method. Further, the epitaxial growth (i.e., deposition) is continued so that the N type column 26 is covered with the P type crystal film (i.e., the P-type-body-region-to-be-formed region). Thus, the super junction construction is formed, and the P type crystal film is formed on the super junction construction. The P type crystal film becomes the P type body region 30. Therefore, the process for forming the P type column 24 and the process for forming the P type body region 30 can be performed successively. Specifically, two processes are performed by continuous one process, so that the manufacturing method is simplified.

Figure 20:
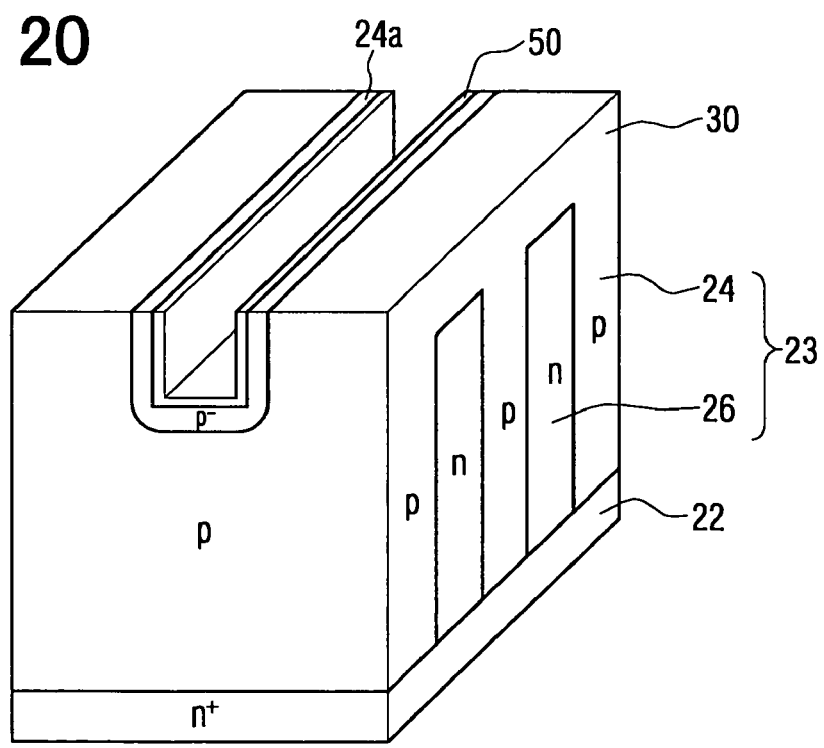
FIG. 20 is a perspective view explaining the method for manufacturing the device according to the fourth embodiment.

Next, as shown in FIG. 20, a trench is formed such that the P type body region 30 is etched and removed until the N type column 26 is exposed. Specifically, a photo resist is applied on the surface of the P type body region 30. Then, a part of the photo resist is removed by the photo lithography method so that a trench-to-be-formed region of the P type body region 30 is exposed. The exposed P type body region 30 is perpendicular to the extending direction of the N type column 26. Next, the exposed P type body region 30 is etched and removed by the dry etching method such as RIE or the like, which is an anisotropic etching method. Thus, the trench is formed. The trench has a predetermined depth, and the trench reaches the upside of the N type column 26.

Next, the sidewall of the trench is oxidized so that an oxide film 50 is formed. The thickness of the oxide film 50 is thicker than that of the gate insulation film 34, which is formed later. The oxide film 50 can be formed by a conventional sacrifice oxidation method. When the sidewall of the trench is oxidized, the impurity of the P type column 24 is segregated to the oxide film 50 during the oxidation process. Specifically, the impurity of the P type column 24 disposed near the interface between the oxide film 50 and the P type column 24 is segregated (i.e., the impurity is distributed again). Thus, the impurity concentration of the parts of the P type body region 30 and the P type column 24 facing the trench is reduced so that the P⁻ type region 24a is formed.

Figure 21:
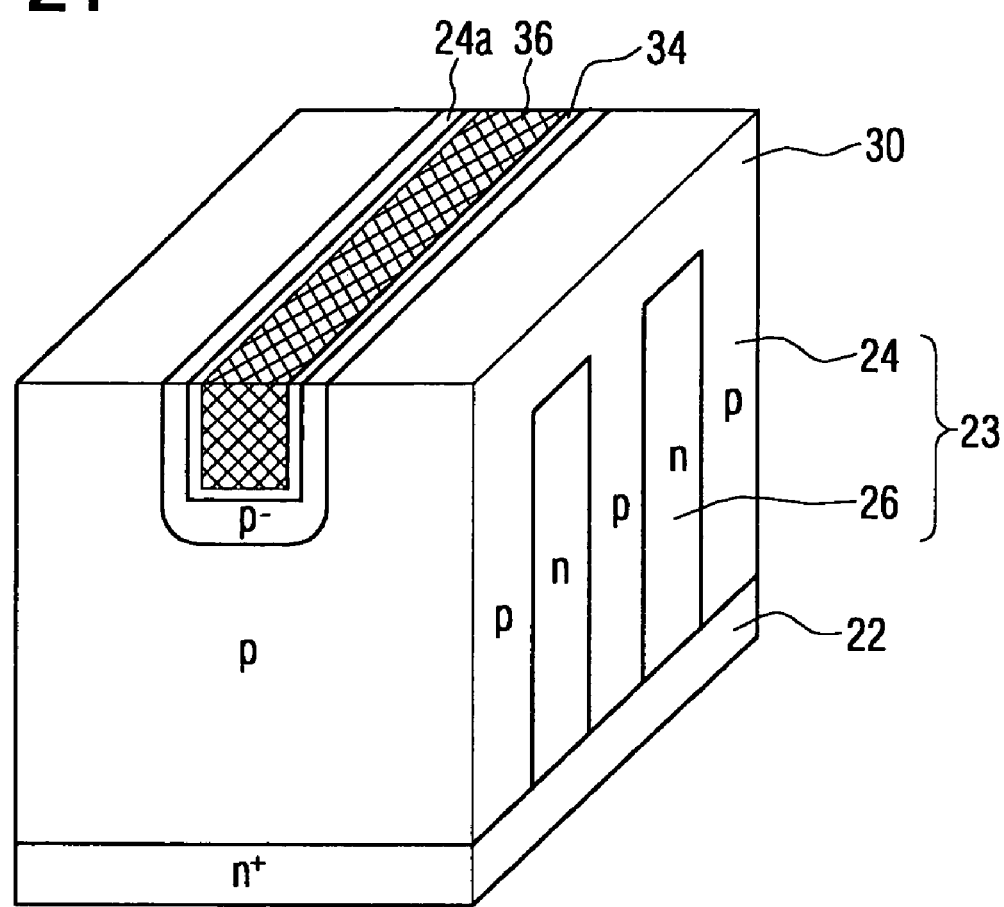
FIG. 21 is a perspective view explaining the method for manufacturing the device according to the fourth embodiment.

As shown in FIG. 21, the oxide film 50 is etched and removed. Then, the gate insulation layer 34 is formed along with the sidewall of the trench by the thermal oxidation method, the CVD method or the like. Next, the electrode material such as poly silicon or the like is deposited in the trench by the CVD or the like so that the trench gate electrode 36 is formed. The source region 32 and the body contact region 30a are formed by the same manner as the first method of the semiconductor device 6 shown in FIG. 15. Thus, the semiconductor device 7 is completed.

In the above method, the process for forming the oxide film 50 can be omitted so that the trench gate electrode 36 is formed directly. In this case, the semiconductor device 7 has the impurity concentration of the P type column 24 equal to that of the P type body region 30.

Such changes and modifications are to be understood as being within the scope of the present invention as defined by the appended claims.

What is claimed is:

1. A semiconductor device comprising:
 a body region having a first conductive type;
 a drift region including a first part and a second part; and
 a trench gate electrode,
 wherein the body region is disposed on the drift region,
 wherein the first part of the drift region has the first conductive type, and extends in an extending direction,
 wherein the second part of the drift region has a second conductive type, is disposed adjacent to the first part of the drift region, and extends in the extending direction,
 wherein the trench gate electrode penetrates the body region and reaches the drift region so that the trench gate electrode contacts the body region and the drift region through an insulation layer,
 wherein the trench gate electrode extends in a direction crossing with the extending direction of the first and second parts,
 wherein the first part of the drift region includes a first portion contacting the trench gate electrode and a second portion apart form the trench gate electrode, wherein the first portion of the first part of the drift region has an impurity concentration, which is lower than that of the body region and that of the second portion of the first part of the drift region, wherein the second part of the drift region has a homogeneous impurity concentration, wherein a part of the body region facing a side of the trench gate electrode provides an inversion layer when a predetermined voltage is applied to the trench gate electrode, and wherein the portion of the first part provides another inversion layer when the predetermined voltage is applied to the trench gate electrode so that current flows through the second part of the drift region and the portion of the first part.

2. The device according to claim 1, further comprising:
a plurality of first parts of the drift region; and
a plurality of second parts of the drift region.
wherein the first parts and the second parts are disposed alternately along with a repeat direction, which is perpendicular to the extending direction.

3. The device according to claim 1, further comprising:
a source region having the second conductive type,
wherein the source region is disposed on a surface of the body region, and adjacent to the trench gate electrode through the insulation layer.

4. The device according to claim 3, wherein the source region extends along with the trench gate electrode.

5. The device according to claim 1, further comprising:
a drain region having the second conductive type,
wherein the drain region is disposed under the drift region, wherein the first part of the drift region extends between the body region and the drain region in the extending direction, and
wherein the second part of the drift region extends between the body region and the drain region in the extending direction.

6. The device according to claim 1, wherein the portion of the first part surrounds the trench gate electrode through the insulation layer.

7. The device according to claim 1, further comprising:
a plurality of trench gate electrodes aligned in parallel together,
wherein the trench gate electrodes are disposed separately so that the body region is sandwiched between the trench gate electrodes.

8. The device according to claim 7, further comprising:
a plurality of source regions having the second conductive type,
wherein each source region is disposed on a surface of the body region, and adjacent to the trench gate electrode through the insulation layer.

9. The device according to claim 8, further comprising:
a plurality of body contact regions having the first conductive type,
wherein each body contact region is disposed on the surface of the body region, and sandwiched between the trench gate electrodes through the source regions.

10. The device according to claim 1, further comprising:
a source region having the second conductive type; and
a drain region having the second conductive type,
wherein the source region is disposed on a surface of the body region, and adjacent to the trench gate electrode through the insulation layer,
wherein the drain region is disposed under the drift region, wherein the first part of the drift region extends between the body region and the drain region in the extending direction, wherein the second part of the drift region extends between the body region and the drain region in the extending direction, and wherein the source region, the body region, the drift region, the drain region and the trench gate electrode provide a vertical type MOSFET.

11. A semiconductor device comprising:
a body region having a first conductive type;
a source region having a second conductive type;
a drift region including a plurality of first parts and a plurality of second parts;
a drain region having the second conductive type; and
a trench gate electrode,
wherein the body region separates the source region and the drift region,
wherein the first parts of the drift region extend between the body region and the drain region in an extending direction, and have the first conductive type,
wherein the second parts of the drift region extend between the body region and the drain region in the extending direction, and have the second conductive type,
wherein the first parts and the second parts are disposed alternately along with a repeat direction, which is perpendicular to the extending direction, so that each first part is disposed adjacent to the second part,
wherein the trench gate electrode penetrates the body region, extends in the repeat direction, and faces the drift region, the body region and the source region through an insulation film,
wherein the first parts of the drift region each include a first portion contacting the trench gate electrode and a second portion apart from the trench gate electrode,
wherein the first portion of each of the first parts has a first impurity concentration, which is lower than that of the body region and that of a corresponding second portion of the first part and the first portion of the first part has a same conductive type as the body region,
wherein the second parts of the drift region each have a homogeneous impurity concentration,
wherein the first parts of the drift region, except for the portion near the trench gate electrode, each have a second impurity concentration, which is higher than that of the body region,
wherein a part of the body region facing a side of the trench gate electrode provides an inversion layer when a predetermined voltage is applied to the trench gate electrode, and
wherein the portion of the first part provides another inversion layer when the predetermined voltage is applied to the trench gate electrode so that current flows through the second part of the drift region and the portion of the first part.

12. The semiconductor device according to claim 11, further comprising:
a plurality of trench gate electrodes aligned in parallel together,
wherein the plurality of trench gate electrodes are disposed separately so that the body region is sandwiched between the trench gate electrodes.

13. The semiconductor device according to claim 12, further comprising:
a plurality of source regions having the second conductive type, wherein each of the plurality of source regions is disposed on a surface of the body region, and adjacent to one of the plurality of trench gate electrodes through the insulation layer.

14. The semiconductor device according to claim 13, further comprising:
   a plurality of body contact regions having the first conductive type,
   wherein each of the plurality of body contact region is disposed on the surface of the body region, and sandwiched between one of the plurality of trench gate electrodes through one of the plurality of source regions.

15. A semiconductor device comprising:
   a drift region including a first part and a second part;
   a body region, having a first conductivity type, disposed on the drift region; and
   a trench gate electrode formed over the drift region and through the body region that contacts the drift region and the body region through an insulation layer,
   wherein the first part of the drift region has the first conductive type, and extends in an extending direction,
   wherein the second part of the drift region has a second conductive type, is disposed adjacent to the first part of the drift region, and extends in the extending direction,
   wherein the trench gate electrode extends in a direction different from the extending direction of the first and second parts,
   wherein the first part of the drift region includes a first portion contacting the trench gate electrode and a second portion apart form trench gate electrode,
   wherein the first portion of the first part of the drift region has a first impurity concentration that is lower than a body impurity concentration of the body region and a second impurity concentration of the second portion of the first part of the drift region, and
   wherein the second part of the drift region has a homogeneous impurity concentration.

16. The semiconductor device according to claim 15,
   wherein apart of the body region facing a side of the trench gate electrode provides an inversion layer when a predetermined voltage is applied to the trench gate electrode, and
   wherein the portion of the first part provides another inversion layer when the predetermined voltage is applied to the trench gate electrode so that current flows through the second part of the drift region and the portion of the first part.

17. The semiconductor device according to claim 15, further comprising:
   a plurality of first parts of the drift region; and
   a plurality of second parts of the drift region,
   wherein the first parts and the second parts are disposed alternately along with a repeat direction, which is perpendicular to the extending direction.

18. The semiconductor device according to claim 15, further comprising:
   a source region having the second conductive type,
   wherein the source region is disposed on a surface of the body region, and adjacent to the trench gate electrode through the insulation layer.

19. The semiconductor device according to claim 15, further comprising:
   a drain region having the second conductive type,
   wherein the drain region is disposed under the drift region, wherein the first part of the drift region extends between the body region and the drain region in the extending direction, and
   wherein the second part of the drift region extends between the body region and the drain region in the extending direction.

* * * * *